US012685190B2

(12) United States Patent
 Jung et al.

(10) Patent No.: US 12,685,190 B2
(45) Date of Patent: Jul. 14, 2026

(54) SEMICONDUCTOR PACKAGES HAVING A COUPLING MEMBER INCLUDING A VERTICAL WIRE AND A METAL PORTION EXTENDING AROUND THE VERTICAL WIRE

(71) Applicant: SAMSUNG ELECTRONICS CO., LTD., Suwon-si (KR)

(72) Inventors: Jaemok Jung, Suwon-si (KR); Un-Byoung Kang, Suwon-si (KR); Dowan Kim, Suwon-si (KR); Sung Keun Park, Suwon-si (KR); Jongho Park, Suwon-si (KR); Ju-Il Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 360 days.

(21) Appl. No.: 18/356,721

(22) Filed: Jul. 21, 2023

(65) Prior Publication Data

US 2024/0203855 A1    Jun. 20, 2024

(30) Foreign Application Priority Data

Dec. 15, 2022    (KR) ........................ 10-2022-0176215

(51) Int. Cl.
*H10W 70/63*        (2026.01)
*H10W 20/00*        (2026.01)
                    (Continued)

(52) U.S. Cl.
CPC ....... *H10W 70/635* (2026.01); *H10W 20/087* (2026.01); *H10W 20/20* (2026.01);
                    (Continued)

(58) Field of Classification Search
CPC ............ H01L 23/49827; H01L 23/481; H01L 21/565; H01L 2224/32235; H10W 70/635; H10W 72/20; H10W 74/00; H10W 74/016
See application file for complete search history.

(56) References Cited

U.S. PATENT DOCUMENTS 6,476,503 B1    11/2002  Imamura et al.
6,690,090 B2 *   2/2004  Kimura .............. H01L 23/3114
                                                257/737
                    (Continued)

FOREIGN PATENT DOCUMENTS

CN        113725105 A    11/2021
KR        101065165 B1    9/2011
                    (Continued)

*Primary Examiner* — Khiem D Nguyen
(74) *Attorney, Agent, or Firm* — Wolf, Greenfield & Sacks, P.C.

(57)        ABSTRACT

An embodiment provides a semiconductor package including: a first redistribution layer substrate; a semiconductor chip on the first redistribution layer substrate; a coupling member on the first redistribution layer substrate, wherein the coupling member is spaced apart from the semiconductor chip; an encapsulant on the first redistribution layer substrate, the semiconductor chip, and the coupling member; and a second redistribution layer substrate on the encapsulant, wherein the coupling member includes a vertical wire and a metal portion extending around the vertical wire, and wherein a first end of the coupling member is electrically connected to the first redistribution layer substrate, and a second end of the coupling member is electrically connected to the second redistribution layer substrate.

11 Claims, 20 Drawing Sheets

(51) Int. Cl.

| | | |
|---|---|---|
| *H10W 20/20* | (2026.01) | |
| *H10W 74/01* | (2026.01) | |
| *H10W 74/10* | (2026.01) | |
| *H10W 72/90* | (2026.01) | |
| *H10W 74/00* | (2026.01) | |
| *H10W 80/00* | (2026.01) | |
| *H10W 90/00* | (2026.01) | |

(52) U.S. Cl.
CPC ........ *H10W 74/016* (2026.01); *H10W 74/117* (2026.01); *H10W 72/932* (2026.01); *H10W 74/00* (2026.01); *H10W 80/732* (2026.01); *H10W 90/732* (2026.01); *H10W 90/734* (2026.01); *H10W 90/794* (2026.01)

(56) References Cited

U.S. PATENT DOCUMENTS

| | | | |
|---|---|---|---|
| 7,884,454 | B2 | 2/2011 | Lu et al. |
| 8,791,575 | B2 | 7/2014 | Oganesian et al. |
| 9,601,454 | B2 | 3/2017 | Zhao et al. |
| 9,875,980 | B2 | 1/2018 | Rinne et al. |
| 11,145,620 | B2 | 10/2021 | Goh et al. |
| 2010/0047934 | A1* | 2/2010 | Hembree ........... G01R 1/06716 257/E21.531 |
| 2011/0260317 | A1* | 10/2011 | Lu ........................... H01L 24/11 257/E23.079 |
| 2015/0021760 | A1* | 1/2015 | Lin ................... H01L 23/49811 257/737 |
| 2015/0340332 | A1* | 11/2015 | Rinne .................... H01L 24/11 257/737 |
| 2017/0256517 | A1 | 9/2017 | Kim et al. |
| 2018/0366411 | A1* | 12/2018 | Suk ......................... H01L 24/19 |
| 2019/0363045 | A1* | 11/2019 | Yu ....................... H01L 25/0657 |
| 2020/0006290 | A1* | 1/2020 | Chang Chien .......... H01L 25/50 |
| 2020/0185352 | A1* | 6/2020 | Lee ................... H01L 21/76849 |
| 2020/0286855 | A1 | 9/2020 | Goh et al. |
| 2022/0059503 | A1 | 2/2022 | Kim et al. |

FOREIGN PATENT DOCUMENTS

| | | |
|---|---|---|
| KR | 101629273 B1 | 6/2016 |
| KR | 101681616 B1 | 12/2016 |
| KR | 102423324 B1 | 7/2022 |

* cited by examiner

FIG. 2A
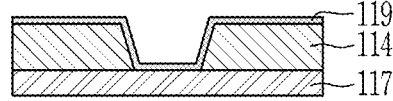
FIG. 2B
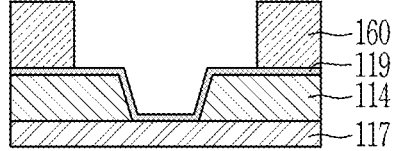
FIG. 2C
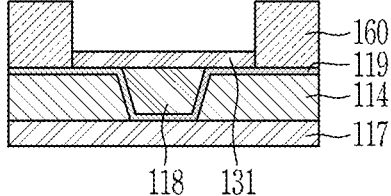
FIG. 2D
FIG. 2E
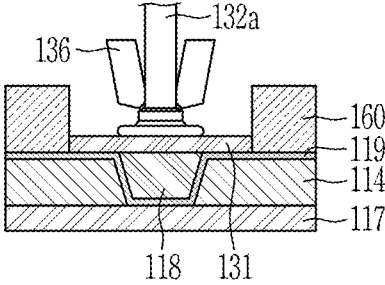

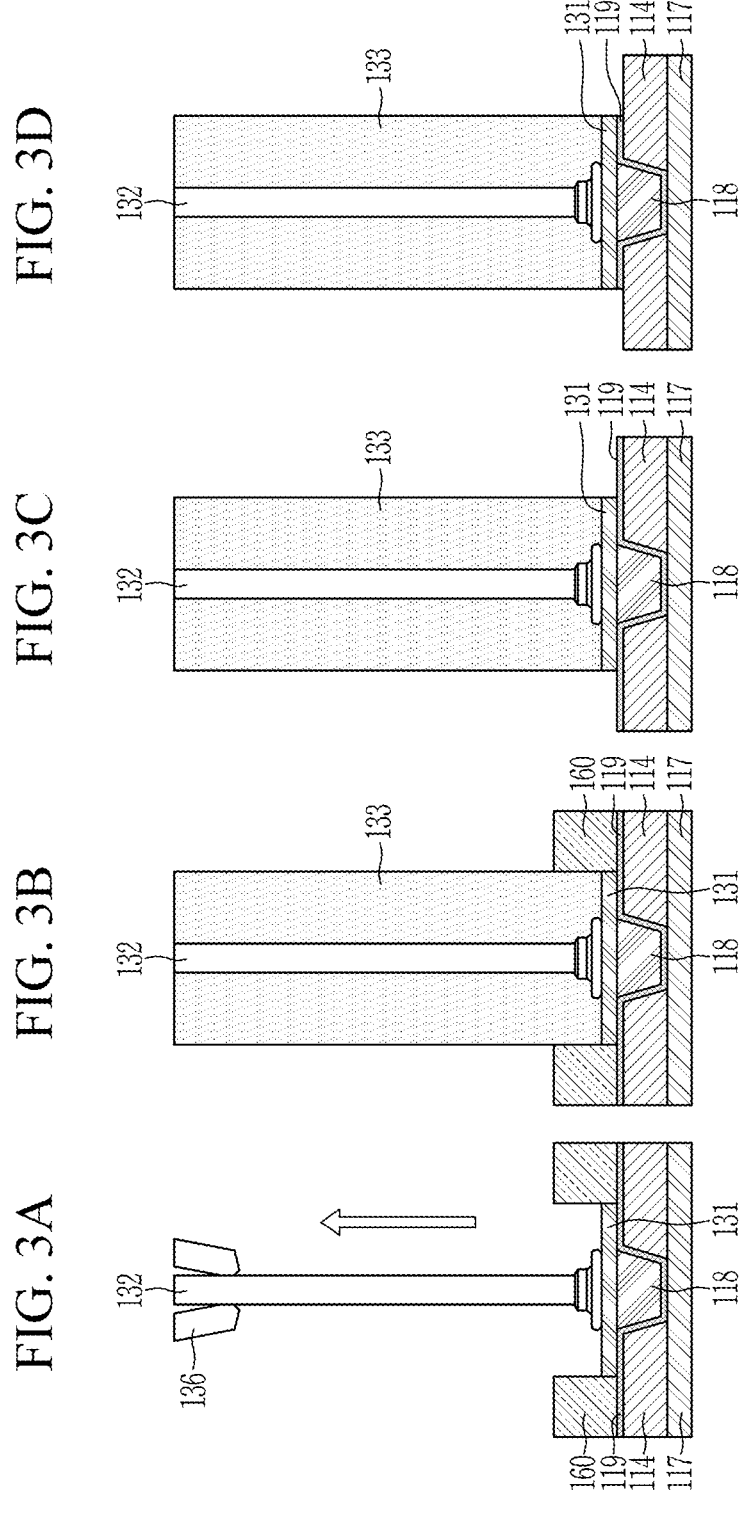

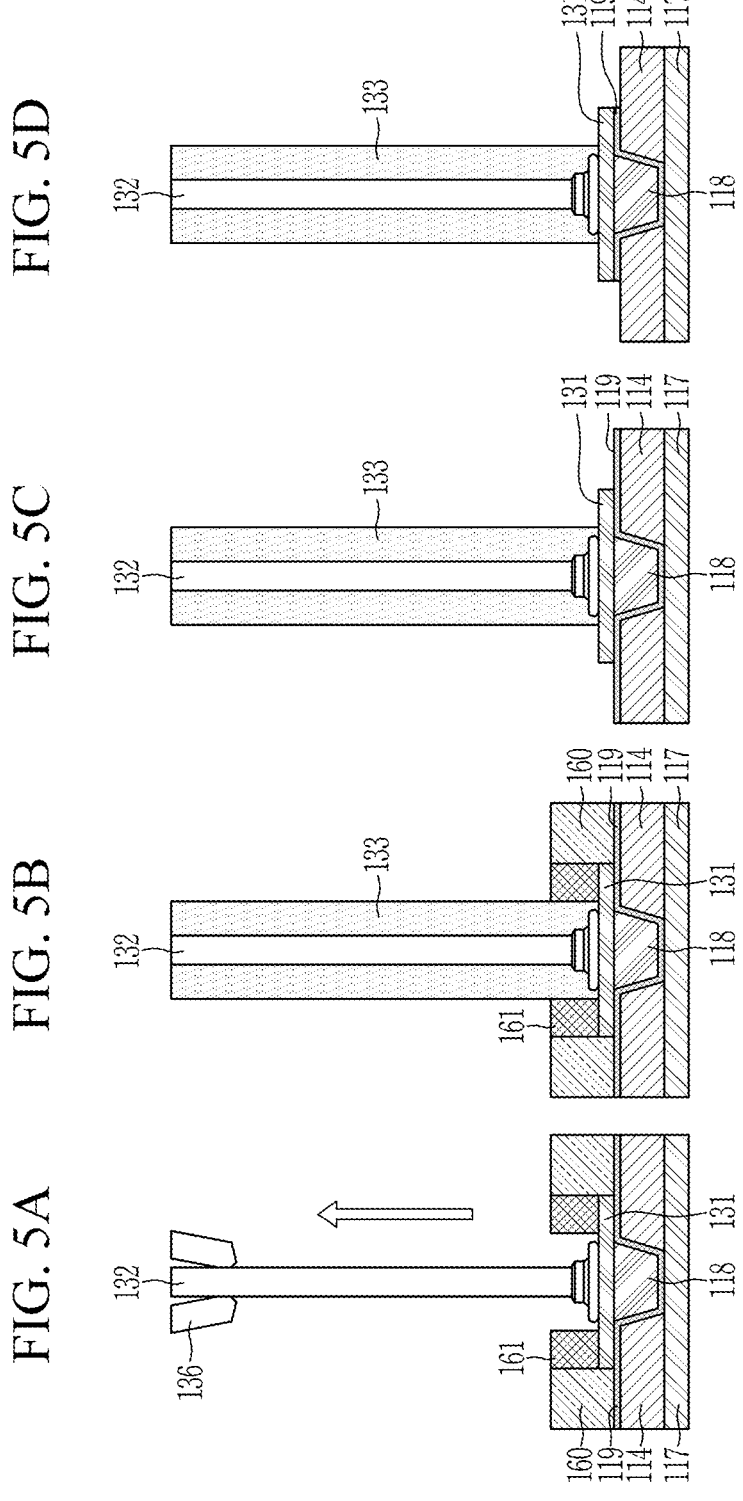

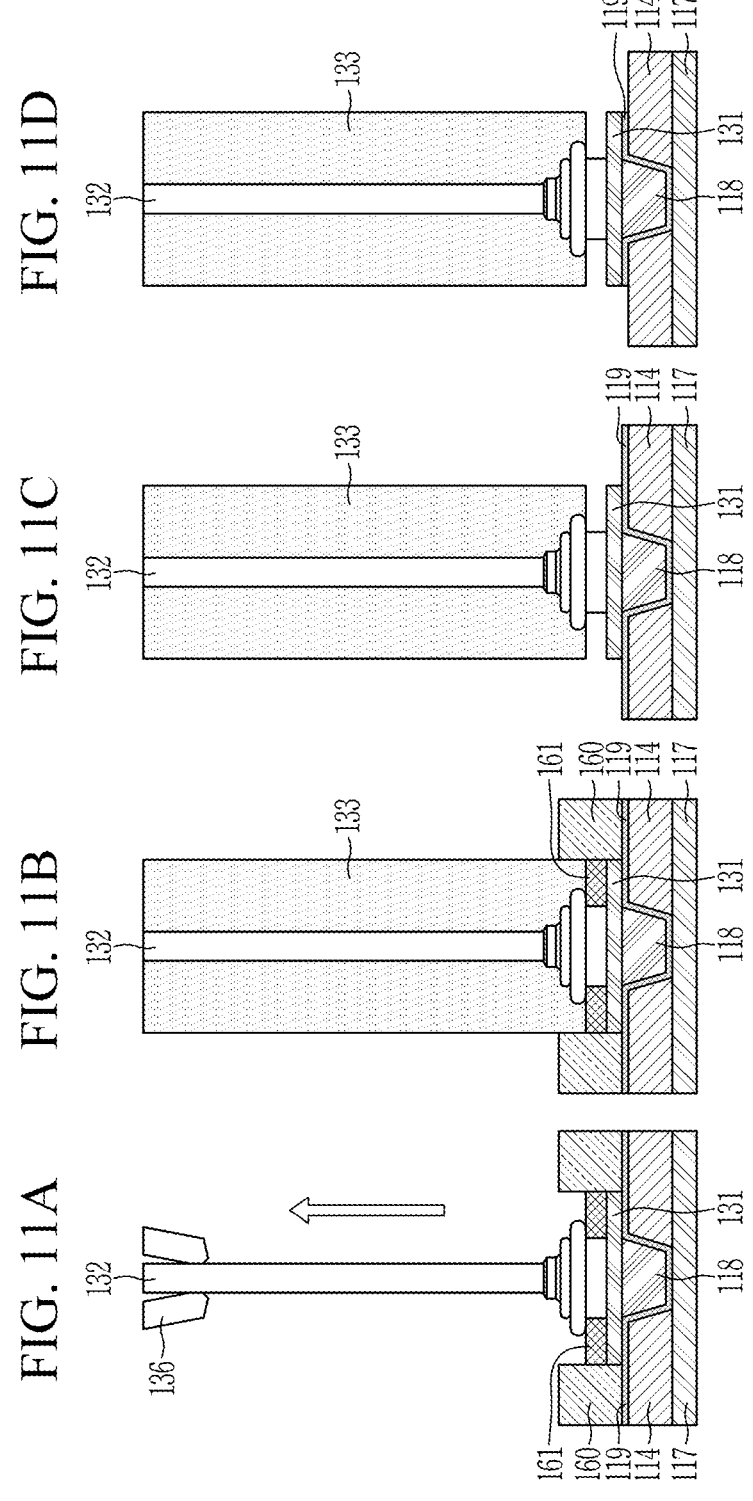

SEMICONDUCTOR PACKAGES HAVING A COUPLING MEMBER INCLUDING A VERTICAL WIRE AND A METAL PORTION EXTENDING AROUND THE VERTICAL WIRE

CROSS-REFERENCE TO RELATED APPLICATION

This application claims priority to and the benefit of Korean Patent Application No. 10-2022-0176215 filed in the Korean Intellectual Property Office on Dec. 15, 2022, the entire contents of which are incorporated herein by reference.

BACKGROUND OF THE INVENTION

The present disclosure relates to semiconductor packages and methods for fabricating the same.

The semiconductor industry field is pursuing improvement in integration density so that more passive or active devices may be integrated in a given area. However, in the semiconductor industry field, as technology development for miniaturizing a circuit line width of a front end semiconductor process gradually faces limitations, there is a trend to supplement the limitations of the front end semiconductor process by developing a semiconductor package technology capable of having high integrated density.

Accordingly, as a package technology is developed according to this trend, a package-on-package (POP) technology in which an upper semiconductor package is stacked on a lower semiconductor package is well known.

A conventional package-on-package (POP) may have a structure in which signals and power are transmitted to an upper semiconductor package and a lower semiconductor package by connecting a back side redistribution layer (BRDL) substrate of the upper semiconductor package and a front side redistribution layer (FRDL) substrate of the lower semiconductor package with a metal post.

However, as a semiconductor chip mounted inside the lower semiconductor package has high integration density, a vertical height of the metal post may be increased.

The metal post may be formed by performing a series of processes such as photoresist deposition, photomask deposition, exposure, development, etching, metal deposition, and chemical mechanical polishing (CMP). When the vertical height of the metal post is increased, this series of processes may be repeated several times and may result in problems such as complexity of the processes and high cost.

SUMMARY OF THE INVENTION

Aspects of the present disclosure are to provide semiconductor packages and methods for fabricating the same that may connect a front side redistribution layer (FRDL) substrate of a lower semiconductor package and a back side redistribution layer (BRDL) substrate of an upper semiconductor package with a coupling member including a vertical wire and a metal portion extending around (e.g., surrounding) the vertical wire.

Aspects of the present disclosure are to provide semiconductor packages and methods for fabricating the same that may form coupling members having various shapes by combining a first photoresist pattern forming a bonding pad and a second photoresist pattern forming a metal portion.

An embodiment provides a semiconductor package including: a first redistribution layer substrate; a semiconductor chip on the first redistribution layer substrate; a coupling member on the first redistribution layer substrate, wherein the coupling member is spaced apart from the semiconductor chip; an encapsulant on the first redistribution layer substrate, the semiconductor chip, and the coupling member; and a second redistribution layer substrate on the encapsulant, wherein the coupling member includes a vertical wire and a metal portion extending around the vertical wire, and wherein a first end of the coupling member is electrically connected to the first redistribution layer substrate, and a second end of the coupling member is electrically connected to the second redistribution layer substrate.

The vertical wire includes at least one of gold, silver, copper, and an alloy thereof.

The metal portion includes at least one of copper, nickel, zinc, gold, silver, platinum, palladium, chromium, titanium, and an alloy thereof.

Another embodiment provides a semiconductor package including: a first redistribution layer substrate including a redistribution line and a redistribution via on the redistribution line; a bonding pad on the redistribution line and the redistribution via; a coupling member on the bonding pad; a semiconductor chip on the first redistribution layer substrate, wherein the semiconductor chip is spaced apart from the coupling member; a connection member that electrically connects the first redistribution layer substrate and the semiconductor chip; an encapsulant on the bonding pad, the coupling member, the connection member, and the semiconductor chip; and a second redistribution layer substrate on the encapsulant, wherein the coupling member includes a vertical wire and a metal portion extending around the vertical wire, and wherein a first end of the coupling member is electrically connected to the bonding pad, and a second end of the coupling member is electrically connected to the second redistribution layer substrate.

The bonding pads includes at least one of copper, nickel, zinc, gold, silver, platinum, palladium, chromium, titanium, and an alloy thereof.

The vertical wire is on an upper surface and a side surface of the boding pad.

A width of the coupling member in a direction is the same as a width of the bonding pad in the direction.

A width of the coupling member in a direction is narrower than a width of the bonding pad in the direction.

A width of the bonding pad in a direction is narrower than a width of the coupling member in the direction and wider than a width of the vertical wire in the direction.

A lowermost end of the metal portion is spaced apart from an uppermost end of the bonding pad.

A lowermost end of the metal portion is in contact with an uppermost end of the bonding pad.

Another embodiment provides a method for fabricating a semiconductor package, the method including: forming a bonding pad on a first redistribution layer substrate; bonding a first end of a vertical wire on the bonding pad; electroplating on the vertical wire to form a metal portion around the vertical wire; mounting a semiconductor chip on the first redistribution layer substrate; molding the metal portion and the semiconductor chip with an encapsulant; and forming a second redistribution layer substrate on the encapsulant, wherein a second end of the vertical wire is bonded to the second redistribution layer substrate.

The step of forming the bonding pad on the first redistribution layer substrate includes: forming a first photoresist pattern including a first opening on the first redistribution layer substrate; and forming the bonding pad in the first opening.

In the step of electroplating the vertical wire to form the metal portion around the vertical wire, a side surface of the metal portion contacts a side surface of the first photoresist pattern defining the first opening.

The step of forming the bonding pad on the first redistribution layer substrate further includes: stripping the first photoresist pattern; and forming a second photoresist pattern including a second opening, wherein a side surface of the metal portion contacts a side surface of the second photoresist pattern defining the second opening.

The step of forming the bonding pad on the first redistribution layer substrate further includes forming a second photoresist pattern including a second opening within the first opening of the first photoresist pattern, wherein a side surface of the metal portion contacts a side surface of the second photoresist pattern defining the second opening.

The method for fabricating the semiconductor package further includes performing surface-treating on the bonding pad before the bonding the first end of the vertical wire on the bonding pad.

The method for fabricating the semiconductor package may further include forming a metal seed layer on the first redistribution layer substrate before the forming of the plurality of bonding pads on the first redistribution layer substrate.

After the step of molding the metal portion and the semiconductor chip with the encapsulant, a chemical mechanical polishing (CMP) process is performed on an upper surface of the encapsulant.

The step of molding the metal portion and the semiconductor chip with the encapsulant includes performing compression molding or transfer molding.

According to the embodiment, it is possible to provide a semiconductor package and a method for fabricating the same that may connect a front side redistribution layer (FRDL) substrate of a lower semiconductor package and a back side redistribution layer (BRDL) substrate of an upper semiconductor package with a coupling member including a vertical wire and a metal portion surrounding the vertical wire. As a result, a vertical height of a semiconductor chip increases and a distance between the lower semiconductor package and the upper semiconductor package increases, and accordingly, a vertical height of a metal post connecting the lower semiconductor package and the upper semiconductor package increases. When the vertical height of the metal post increases, since a series of processes for manufacturing the metal post must be repeatedly performed to form a high metal post, there is a problem that the manufacturing process becomes complicated and the process cost increases, thus according to the semiconductor package and the method for fabricating the same according to the present disclosure, these problems may be solved.

According to the embodiment, a semiconductor package and a method for fabricating the same that use a vertical wire having a very thin thickness as a coupling member connecting a lower semiconductor package and an upper semiconductor package may be provided. As a result, it is possible to form coupling members including vertical wires disposed with a fine pitch, and since a cost of forming the coupling members including the vertical wires is smaller than a cost of forming a high metal post, a cost may be reduced, and a coupling member having a high aspect ratio may be formed by reflecting a characteristic of a wire that may be formed long.

According to the embodiment, a semiconductor package and a method for fabricating the same that may include a vertical wire surrounded by metal by performing a plating process on the vertical wire may be provided. Accordingly, it is possible to prevent the vertical wire from being swept during a molding process.

According to the embodiment, a semiconductor package and a method for fabricating the same that may be formed by combining a first photoresist pattern forming a bonding pad and a second photoresist pattern forming a metal portion may be provided. Accordingly, it is possible to provide coupling members having various shapes according to the use and purpose of the semiconductor package.

BRIEF DESCRIPTION OF THE DRAWINGS

FIGS. 2A to 2E illustrate cross-sectional views of intermediate structures corresponding to intermediate steps for illustrating a method for manufacturing a semiconductor package according to some embodiments.

FIGS. 3A to 3D illustrate cross-sectional views of intermediate structures corresponding to intermediate steps for illustrating a method for manufacturing a semiconductor package according to some embodiments.

FIGS. 5A to 5D illustrate cross-sectional views of intermediate structures corresponding to intermediate steps for illustrating a method for manufacturing a semiconductor package according to some embodiments.

FIGS. 11A to 11D illustrate cross-sectional views of intermediate structures corresponding to intermediate steps for illustrating a method for manufacturing a semiconductor package according to some embodiments.

FIG. 12 illustrates a cross-sectional view of an intermediate structure corresponding to intermediate steps for illustrating a method for manufacturing a semiconductor package according to some embodiments.

FIG. 13 illustrates a cross-sectional view of an intermediate structure corresponding to intermediate steps for illustrating a method for manufacturing a semiconductor package according to some embodiments.

FIG. 14 illustrates a cross-sectional view of an intermediate structure corresponding to intermediate steps for illustrating a method for manufacturing a semiconductor package according to some embodiments.

FIG. 15 illustrates a cross-sectional view of an intermediate structure corresponding to intermediate steps for illustrating a method for manufacturing a semiconductor package according to some embodiments.

DETAILED DESCRIPTION OF THE EMBODIMENTS

Figure 1:
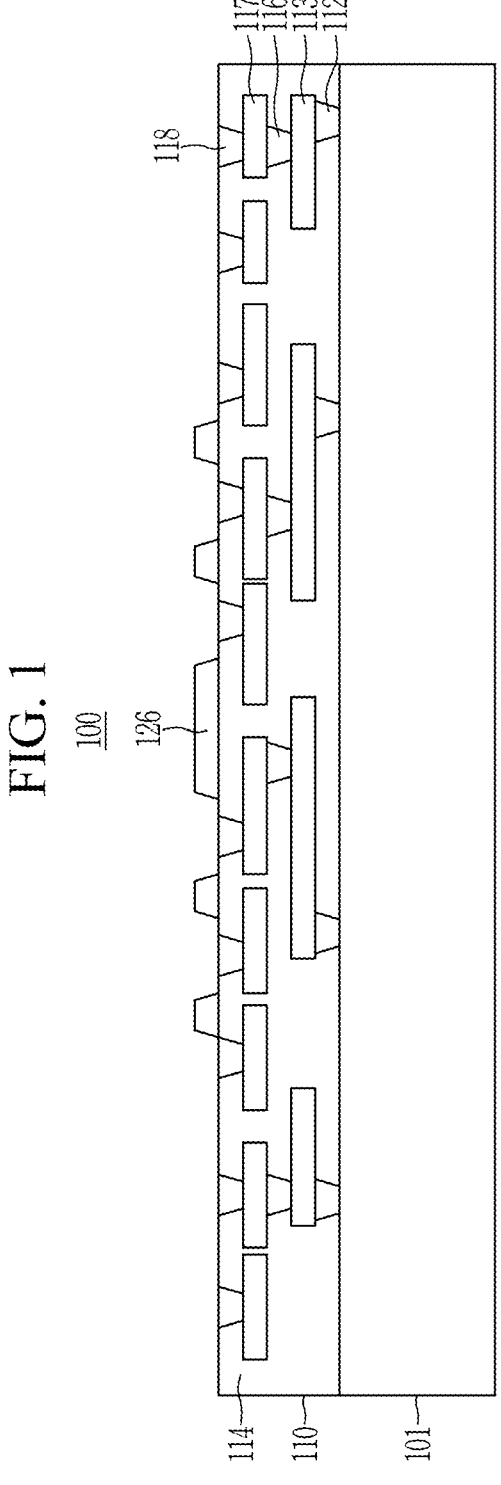
FIG. 1 illustrates a cross-sectional view of an intermediate structure corresponding to intermediate steps for illustrating a method for manufacturing a semiconductor package according to some embodiments.

The present disclosure will be described more fully hereinafter with reference to the accompanying drawings, in which embodiments of the disclosure are shown. As those skilled in the art would realize, the described embodiments may be modified in various different ways, all without departing from the scope of the present disclosure.

For simplicity and clarity of illustration, elements in the drawings may not be necessarily drawn to scale. The same reference numbers in different drawings may represent the same or similar elements, and as such may perform similar functionality. Further, descriptions and details of well-known steps and elements may be omitted for simplicity of the description. Furthermore, in the detailed description of the present disclosure, numerous specific details are set forth in order to provide a thorough understanding of the present disclosure. However, it will be understood that the present disclosure may be practiced without these specific details. In other instances, well-known methods, procedures, components, and circuits may not be described in detail so as not to unnecessarily obscure aspects of the present disclosure. It will be understood that the description herein is not intended to limit the claims to the specific embodiments described. On the contrary, it is intended to cover alternatives, modifications, and equivalents as may be included within the scope of the present disclosure as defined by the appended claims.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify an entirety of list of elements and may not modify the individual elements of the list. When referring to "C to D", this means C inclusive to D inclusive unless otherwise specified.

It will be understood that, although the terms "first", "second", "third", and so on may be used herein to illustrate various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described above could be termed a second element, component, region, layer or section, without departing from the scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In contrast, when an element is referred to as being "directly coupled," "directly connected," or "directly responsive" to, or "directly on," another element, there are no intervening elements present. In addition, "electrical connection" conceptually includes a physical connection and a physical disconnection. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like may be disposed "on" or "on a top" of another layer, film, region, plate, or the like, the former may directly contact the latter or still another layer, film, region, plate, or the like may be disposed between the former and the latter. As used herein, when a layer, film, region, plate, or the like is disposed "directly on" or "directly on a top" of another layer, film, region, plate, or the like, the former directly contacts the latter and still another layer, film, region, plate, or the like is not disposed between the former and the latter. Further, as used herein, when a layer, film, region, plate, or the like may be disposed "below" or "under" another layer, film, region, plate, or the like, the former may directly contact the latter or still another layer, film, region, plate, or the like may be disposed between the former and the latter. As used herein, when a layer, film, region, plate, or the like is disposed "directly below" or "directly under" another layer, film, region, plate, or the like, the former directly contacts the latter and still another layer, film, region, plate, or the like is not disposed between the former and the latter.

In one example, when a certain embodiment may be implemented differently, a function or operation specified in a specific block may occur in a sequence different from that specified in a flowchart. For example, two consecutive blocks may actually be executed at the same time. Depending on a related function or operation, the blocks may be executed in a reverse sequence. Moreover, the function or operation in the specific block (e.g., step) may be separated into multiple blocks (e.g., steps) and/or may be at least partially integrated.

In descriptions of temporal relationships, for example, temporal precedent relationships between two events such as "after", "subsequent to", "before", etc., another event may occur therebetween unless "directly after", "directly subsequent" or "directly before" is not indicated.

The features of the various embodiments of the present disclosure may be partially or entirely combined with each other, and may be technically associated with each other or operate with each other. The embodiments may be implemented independently of each other and may be implemented together in an association relationship.

Spatially relative terms, such as "beneath," "below," "lower," "under," "above," "upper," and the like, may be used herein for ease of explanation to illustrate one element or feature's relationship to another element or feature as illustrated in the figures. It will be understood that the spatially relative terms are intended to encompass different orientations of the device in use or in operation, in addition to the orientation depicted in the figures. For example, when the device in the drawings may be turned over, elements described as "below" or "beneath" or "under" other elements or features would then be oriented "above" the other elements or features. Thus, the example terms "below" and "under" may encompass both an orientation of above and below. The device may be otherwise oriented, for example, rotated 90 degrees or at other orientations, and the spatially relative descriptors used herein should be interpreted accordingly. Further, throughout the specification, the phrase "in a plan view" or "on a plane" means viewing a target portion from the top, and the phrase "in a cross-sectional view" or "on a cross-section" means viewing a cross-section formed by vertically cutting a target portion from the side.

Hereinafter, semiconductor packages and methods for fabricating the same according to some embodiments will be described with reference to the accompanying drawings.

FIG. 1 illustrates a cross-sectional view of an intermediate structure corresponding to intermediate steps for illustrating a method for manufacturing a semiconductor package according to some embodiments.

Referring to FIG. 1, a semiconductor package 10 may include a front side redistribution layer substrate 110 formed on a carrier 101.

The carrier 101 may include, for example, a silicon-based material such as glass or silicon oxide, an organic material, another material such as aluminum oxide, a combination of these materials, and/or the like.

The front side redistribution layer substrate 110 may include a first dielectric layer 114, and first redistribution lines 113 and second redistribution lines 117 and first redistribution vias 112, second redistribution vias 116, and third redistribution vias 118 within the first dielectric layer 114. Each of the first and second redistribution lines 113 and 117 may include a plurality of redistribution lines at a same or substantially the same vertical level within the first dielectric layer 114. The vertical level means a distance from a bottom surface of the front side redistribution layer substrate 110 in a third direction Z, perpendicular to the bottom surface (and/or an upper surface) of the front side redistribution layer substrate 110. The first redistribution lines 113 and the second redistribution lines 117 may be disposed at different vertical levels. Each of the first to third redistribution vias 112, 116, and 118 may include a plurality of redistribution vias at a same or substantially the same vertical level within the first dielectric layer 114. The first to third redistribution vias 112, 116, and 118 may be disposed at different vertical levels to each other. In some embodiments, the front side redistribution layer substrate 110 may include fewer or greater numbers of (e.g., fewer or greater numbers of different vertical levels of) redistribution lines and redistribution vias.

In the process of forming the front side redistribution layer substrate 110, the first dielectric layer 114 may be formed on the carrier 101. In some embodiments, the first dielectric layer 114 may include a polymer such as polybenzoxazoles (PBO), polyimide, or the like, but is not limited thereto. In some embodiments, the first dielectric layer 114 may include an inorganic dielectric material such as silicon nitride, silicon oxide, or the like, but is not limited thereto. In some embodiments, the first dielectric layer 114 may be formed through chemical vapor deposition (CVD), atomic layer deposition (ALD), and/or plasma-enhanced chemical vapor deposition (PECVD), but is not limited thereto.

After forming the first dielectric layer 114, the first dielectric layer 114 may be selectively etched to form a via hole, and the via hole may be filled with a conductive material to form the first redistribution vias 112. In some embodiments, the first redistribution vias 112 may include, for example, copper, aluminum, tungsten, nickel, gold, tin, titanium, and/or an alloy thereof. In some embodiments, the first redistribution vias 112 may be formed by performing a sputtering process. In some embodiments, the first redistribution vias 112 may be formed by performing an electroplating process after forming a seed metal layer.

Next, an additional first dielectric layer 114 may be deposited on the first redistribution vias 112 and the previously formed first dielectric layer 114, and the additionally deposited first dielectric layer 114 may be selectively etched to form the first redistribution lines 113 on the first redistribution vias 112. Thereafter, the second redistribution vias 116, the second redistribution lines 117, and the third redistribution vias 118 may be repeatedly formed in the same manner as the first redistribution vias 112 and the previously formed first dielectric layer 114, and the first redistribution lines 113 and the additional first dielectric layer 114 are formed.

Next, a first insulating layer 126 may be formed on the first dielectric layer 114 of the front side redistribution layer substrate 110. In some embodiments, the first insulating layer 126 may be a solder resist. The first insulating layer 126 may include a plurality of openings for soldering (e.g., the second coupling member 125 in FIG. 13).

FIGS. 2A to 2E illustrate cross-sectional views of intermediate structures corresponding to intermediate steps for illustrating a method for manufacturing a semiconductor package according to some embodiments. FIG. 2A illustrates a cross-sectional view of forming a via hole 102, in which the third redistribution via 118 is to be formed through further processes, in the uppermost first dielectric layer 114 (e.g., lastly disposed additional first dielectric layer 114) of the front side redistribution layer substrate 110; FIG. 2B illustrates a cross-sectional view of forming a metal seed layer 119 on the uppermost first dielectric layer 114 of the front side redistribution layer substrate 110 and in the via hole 102 of the uppermost first dielectric layer 114; FIG. 2C illustrates a cross-sectional view of forming a first photoresist pattern 160 on the metal seed layer 119 on the front side redistribution layer substrate 110; FIG. 2D illustrates a cross-sectional view of filling the via hole 102 with a metal to form the third redistribution via 118 and form a first bonding pad 131 on the third redistribution via 118; and FIG. 2E illustrates a cross-sectional view of forming (e.g., bonding) a bonding wire 132a on the first bonding pad 131.

Referring to FIG. 2A, the via hole 102 may be formed in the uppermost first dielectric layer 114 on the second redistribution line 117. Since the via hole 102 is formed on the second redistribution line 117, an upper surface of the second redistribution line 117 may be exposed after the via hole 102 is formed.

In some embodiments, the process of forming the via hole 102 may include forming an etching passivation film on the uppermost first dielectric layer 114 of the front side redistribution layer substrate 110, forming an opening by patterning the etching passivation film, performing an etch process on the uppermost first dielectric layer 114 of the front side redistribution layer substrate 110 through the opening, and removing the etch passivation film.

Referring to FIG. 2B, the metal seed layer 119 may be formed on the uppermost first dielectric layer 114 of the front side redistribution layer substrate 110 and within the via holes 102 of the uppermost first dielectric layer 114. In some embodiments, the metal seed layer 119 may include, for example, copper, nickel, zinc, gold, silver, platinum, palladium, chromium, titanium, and/or an alloy thereof, but is not limited thereto.

In some embodiments, the metal seed layer 119 may be formed by electroless plating. In some embodiments, a cleaning process or a metal catalyst activation pretreatment process may be performed prior to the electroless plating. In some embodiments, the metal seed layer 119 may be formed by sputtering.

Referring to FIG. 2C, the first photoresist pattern 160 may be formed on the metal seed layer 119 on the front side redistribution layer substrate 110. The process of forming the first photoresist pattern 160 may include forming a photoresist having a predetermined thickness on the metal seed layer 119, arranging a photomask on the photoresist, and exposing, developing, and etching the photoresist. In some embodiments, the photoresist may include a photosensitive film. The photosensitive film may be formed on the metal seed layer 119 through a lamination process. In some embodiments, a thickness of the first photoresist pattern 160 may be about 10 micrometers (μm) to 100 μm.

Referring to FIG. 2D, the third redistribution via 118 may be formed by filling the via hole 102 with metal, and the first bonding pad 131 may be formed on the third redistribution via 118. Widths of the first bonding pad 131 in a first direction X and/or a second direction Y, parallel with the upper surface (and/or the bottom surface) of the front side redistribution layer substrate 110, may be larger than widths of the third redistribution via 118 in the first direction X and/or the second direction Y. The first and second directions X and Y intersect each other. In some embodiments, at least a portion of an upper surface of the first bonding pad 131 may be exposed from the first photoresist pattern 160. In some embodiments, the third redistribution via 118 and the first bonding pad 131 may include, for example, copper, nickel, zinc, gold, silver, platinum, palladium, chromium, titanium, and/or an alloy thereof.

The third redistribution via 118 and the first bonding pad 131 may be formed by electroplating. The third redistribution via 118 and the first bonding pad 131 may be formed by growing a metal film from the previously formed metal seed layer 119 by electroplating. In some embodiments, an annealing process may be performed after the third redistribution via 118 and the first bonding pad 131 are formed.

Referring to FIG. 2E, one end of the bonding wire 132a may be formed (e.g., bonded) onto the first bonding pad 131 by using a capillary 136 or a wedge (not shown). In some embodiments, before one end of the bonding wire 132a is formed onto the first bonding pad 131, a surface treatment process may be performed to reduce surface roughness of the first bonding pad 131 to improve adhesion to the bonding wire 132a. In some embodiments, the bonding wire 132a may include, for example, gold, silver, copper, and/or an alloy thereof.

In some embodiments, the bonding wire 132a may be bonded to the first bonding pad 131 by performing a thermocompression bonding process, an ultrasonic process, or a thermosonic process, but is not limited thereto.

The thermocompression bonding process may be performed by forming one end of the bonding wire 132a into a ball shape by applying heat to a tip of the capillary 136 and pressing the bonding wire 132a to the first bonding pad 131 to which heat is applied through the capillary 136. The ultrasonic process may be performed by placing the bonding wire 132a on the first bonding pad 131 and applying pressure and ultrasonic waves to the bonding wire 132a through a wedge (not shown) to press the bonding wire 132a to the first bonding pad 131. The thermosonic process may be performed by applying heat to the tip of the capillary 136 to form one end of the bonding wire 132a into a ball shape and applying heat and pressure ultrasonic vibration to the capillary 136 to press the bonding wire 132a to the first bonding pad 131 to which heat is applied.

FIGS. 3A to 3D illustrate cross-sectional views of intermediate structures corresponding to intermediate steps for illustrating a method for manufacturing a semiconductor package according to some embodiments. FIG. 3A illustrates a cross-sectional view of pulling the bonding wire 132a to form a vertical wire 132; FIG. 3B illustrates a cross-sectional view of forming a metal portion 133 extending around (e.g., surrounding) the vertical wire 132; FIG. 3C illustrates a cross-sectional view of stripping the first photoresist pattern 160; and FIG. 3D illustrates a cross-sectional view of removing (e.g., a portion of) the metal seed layer 119.

Referring to FIG. 3A, the vertical wire 132 may be formed by stretching the bonding wire 132a compressed to the first bonding pad 131. For example, the capillary 136 or a wedge (not shown) may be pulled and raised by a predetermined distance in the third direction Z to form the vertical wire 132 so that the other end of the bonding wire 132a opposite to one end of the bonding wire 132a compressed to the first bonding pad 131 may be bonded to a back side redistribution layer substrate (e.g., back side redistribution layer substrate 150 illustrated in FIG. 15). In some embodiments, the width of the vertical wire 132 in the first direction X (and/or the second direction Y) may be about 25 μm to 100 μm. In some embodiments, the height of the vertical wire 132 in the third direction Z (e.g., from the first bonding pad 131) may be about 50 μm to 800 μm.

Referring to FIG. 3B, the metal portion 133 extending around (e.g., surrounding) the vertical wire 132 may be formed. The metal portion 133 may be formed by growing a metal film around the vertical wire 132 by electroplating, but is not limited thereto. In some embodiments, an annealing process may be performed after the metal portion 133 is formed.

In some embodiments, the metal portion 133 may be formed to match a width in the first direction X (and/or the second direction Y) of an opening of the first photoresist pattern 160. For example, the metal portion 133 may fill the opening of the first photoresist pattern 160, so that a side surface of the metal portion 133 may contact a side surface of the first photoresist pattern 160 defining the opening of the first photoresist pattern 160. In some embodiments, a first coupling member 130 (referring to FIG. 12), including the metal portion 133 and the vertical wire 132, may have the same width as the first bonding pad 131 in the first direction X (and/or the second direction Y). In some embodiments, a lowermost end of the metal portion 133 may contact an uppermost end of the first bonding pad 131. In some embodiments, the metal portion 133 may include, for example, copper, nickel, zinc, gold, silver, platinum, palladium, chromium, titanium, and/or an alloy thereof. In some embodiments, the width of the metal portion 133 in the first direction X and/or the second direction Y may be about 5 μm to 100 μm.

Referring to FIG. 3C, the first photoresist pattern 160 may be stripped. In some embodiments, the first photoresist pattern 160 may be stripped by etching or ashing. After the first photoresist pattern 160 is stripped, a side surface of the first bonding pad 131 and a portion of an upper surface of the metal seed layer 119 may be exposed.

Referring to FIG. 3D, after the first photoresist pattern 160 is stripped, the exposed portion of the metal seed layer 119 may be removed. In some embodiments, the exposed portion of the metal seed layer 119 may be removed by etching. After the exposed portion of the metal seed layer 119 is removed, an upper surface of the first dielectric layer 114 of the front side redistribution layer substrate 110 may be exposed.

Figure 4A:
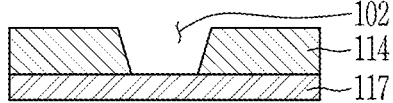
FIGS. 4A to 4F illustrate cross-sectional views of intermediate structures corresponding to intermediate steps for illustrating a method for manufacturing a semiconductor package according to some embodiments.
Figure 4B:
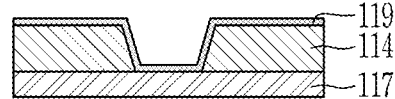
Figure 4C:
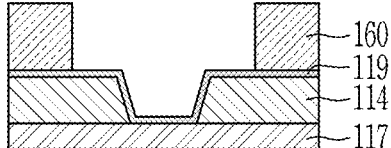
Figure 4D:
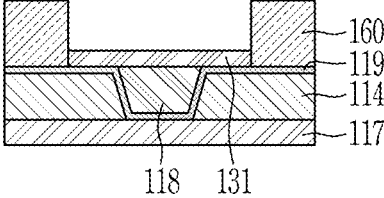
Figure 4E:
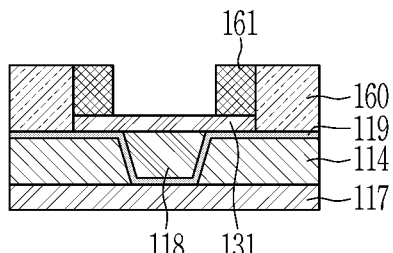
Figure 4F:
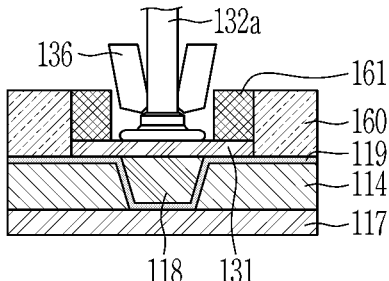

FIGS. 4A to 4F illustrate cross-sectional views of intermediate structures corresponding to intermediate steps for illustrating a method for manufacturing a semiconductor package according to some embodiments. FIG. 4A illustrates a cross-sectional view of forming a via hole 102, in which the third redistribution via 118 is to be formed through further processes, in the uppermost first dielectric layer 114 (e.g., lastly disposed additional first dielectric layer 114) of the front side redistribution layer substrate 110; FIG. 4B illustrates a cross-sectional view of forming the metal seed layer 119 on the uppermost first dielectric layer 114 of the front side redistribution layer substrate 110 and in the via hole 102 of the first dielectric layer 114; FIG. 4C illustrates a cross-sectional view of forming the first photoresist pattern 160 on the metal seed layer 119 on the front side redistribution layer substrate 110; FIG. 4D illustrates a cross-sectional view of filling the via hole 102 with a metal to form the third redistribution via 118 and form the first bonding pad 131 on the third redistribution via 118; FIG. 4E illustrates a cross-sectional view of forming the second photoresist pattern 161 on the first bonding pad 131; and FIG. 4F illustrates a cross-sectional view of forming (e.g., bonding) the bonding wire 132a on the first bonding pad 131.

Contents of FIG. 4A to FIG. 4D may be the same as the contents of FIG. 2A to FIG. 2D described above.

Referring to FIG. 4E, the second photoresist pattern 161 may be formed on the first bonding pad 131. The second photoresist pattern 161 may be formed within the opening of the first photoresist pattern 160. The first photoresist pattern 160 may extend around the second photoresist pattern 161. In some embodiments, at least a portion of an upper surface of the first bonding pad 131 may be exposed from the first and second photoresist patterns 160 and 161. The process of forming the second photoresist pattern 161 may include forming a photoresist having a predetermined thickness on the first bonding pad 131, arranging a photomask on the photoresist, and exposing, developing, and etching the photoresist. In some embodiments, the photoresist may include a photosensitive film. The photosensitive film may be formed on the first bonding pad 131 through a lamination process, but is not limited thereto. In some embodiments, a thickness of the second photoresist pattern 161 may be about 10 μm to 100 μm.

Contents of FIG. 4F may be the same as the contents of FIG. 2E described above.

FIGS. 5A to 5D illustrate cross-sectional views of intermediate structures corresponding to intermediate steps for illustrating a method for manufacturing a semiconductor package according to some embodiments. FIG. 5A illustrates a cross-sectional view of pulling the bonding wire 132a to form the vertical wire 132; FIG. 5B illustrates a cross-sectional view of forming the metal portion 133 extending around (e.g., surrounding) the vertical wire 132; FIG. 5C illustrates a cross-sectional view of stripping the first photoresist pattern 160 and the second photoresist pattern 161; and FIG. 5D illustrates a cross-sectional view of removing (e.g., a portion of) the metal seed layer 119.

Contents of FIG. 5A may be the same as the contents of FIG. 3A described above.

Referring to FIG. 5B, the metal portion 133 extending around (e.g., surrounding) the vertical wire 132 may be formed. The metal portion 133 may be formed by growing a metal film around the vertical wire 132 by electroplating, but is not limited thereto. In some embodiments, the metal portion 133 may be formed to match a width in the first direction X (and/or the second direction Y) of an opening of the second photoresist pattern 161. For example, the metal portion 133 may fill the opening of the second photoresist pattern 161, so that a side surface of the metal portion 133 may contact a side surface of the second photoresist pattern 161 defining the opening of the second photoresist pattern 161. In some embodiments, the first coupling member 130 (referring to FIG. 12), including the metal portion 133 and the vertical wire 132, may have a smaller width in the first direction X (and/or the second direction Y), than that of the first bonding pad 131. In some embodiments, a lowermost end of the metal portion 133 may contact an uppermost end of the first bonding pad 131.

Referring to FIG. 5C, the first photoresist pattern 160 and the second photoresist pattern 161 may be stripped. In some embodiments, the first photoresist pattern 160 and the second photoresist pattern 161 may be stripped by etching or ashing. After the first photoresist pattern 160 and the second photoresist pattern 161 are stripped, a side surface and a portion of the upper surface of the first bonding pad 131 and a portion of the upper surface of the metal seed layer 119 may be exposed.

Contents of FIG. 5D may be the same as the contents of FIG. 3D described above.

Figure 6A:
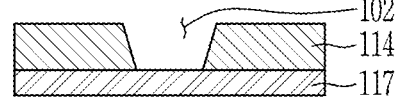
FIGS. 6A to 6G illustrate cross-sectional views of intermediate structures corresponding to intermediate steps for illustrating a method for manufacturing a semiconductor package according to some embodiments.
Figure 6B:
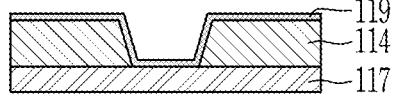
Figure 6C:
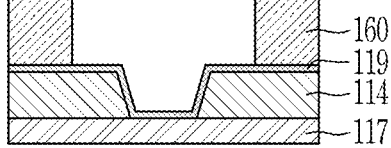
Figure 6D:
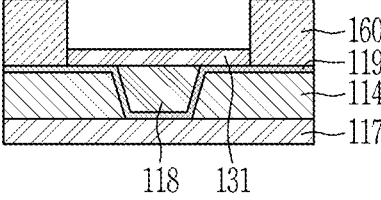
Figure 6E:
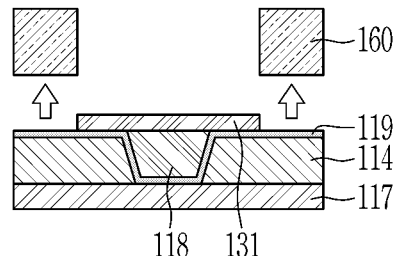
Figure 6F:
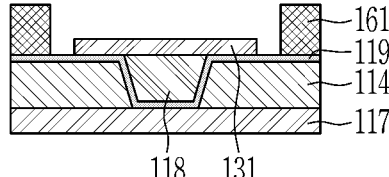
Figure 6G:
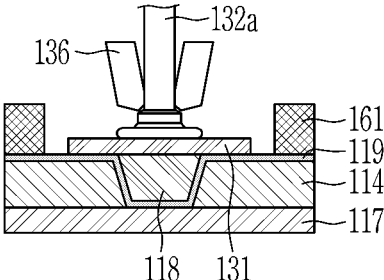

FIGS. 6A to 6G illustrate cross-sectional views of intermediate structures corresponding to intermediate steps for illustrating a method for manufacturing a semiconductor package according to some embodiments. FIG. 6A illustrates a cross-sectional view of forming a via hole 102, in which the third redistribution via 118 is to be formed through further processes, in the uppermost first dielectric layer 114 (e.g., lastly disposed additional first dielectric layer 114) of the front side redistribution layer substrate 110; FIG. 6B illustrates a cross-sectional view of forming the metal seed layer 119 on the uppermost first dielectric layer 114 of the front side redistribution layer substrate 110 and in the via hole 102 of the first dielectric layer 114; FIG. 6C illustrates a cross-sectional view of forming the first photoresist pattern 160 on the metal seed layer 119 on the front side redistribution layer substrate 110; FIG. 6D illustrates a cross-sectional view of filling the via hole 102 with a metal to form the third redistribution via 118 and form the first bonding pad 131 on the third redistribution via 118; FIG. 6E illustrates a cross-sectional view of stripping the first photoresist pattern 160; FIG. 6F illustrates a cross-sectional view of forming the second photoresist pattern 161 on the metal seed layer 119 on the front side redistribution layer substrate 110; and FIG. 6G illustrates a cross-sectional view of forming (e.g., bonding) the bonding wire 132a on the first bonding pad 131.

Contents of FIG. 6A to FIG. 6D may be the same as the contents of FIG. 2A to FIG. 2D described above.

Referring to FIG. 6E, the first photoresist pattern 160 may be stripped. After the first photoresist pattern 160 is stripped, a portion of the upper surface of the metal seed layer 119 may be exposed.

Referring to FIG. 6F, the second photoresist pattern 161 may be formed on the metal seed layer 119 on the front side redistribution layer substrate 110. The second photoresist pattern 161 may be formed to be spaced apart from the first bonding pad 131. After the second photoresist pattern 161 is formed, a portion of the upper surface of the metal seed layer 119 may remain exposed.

Contents of FIG. 6G may be the same as the contents of FIG. 2E described above.

Figures 7A, 7B, 7C, 7D:
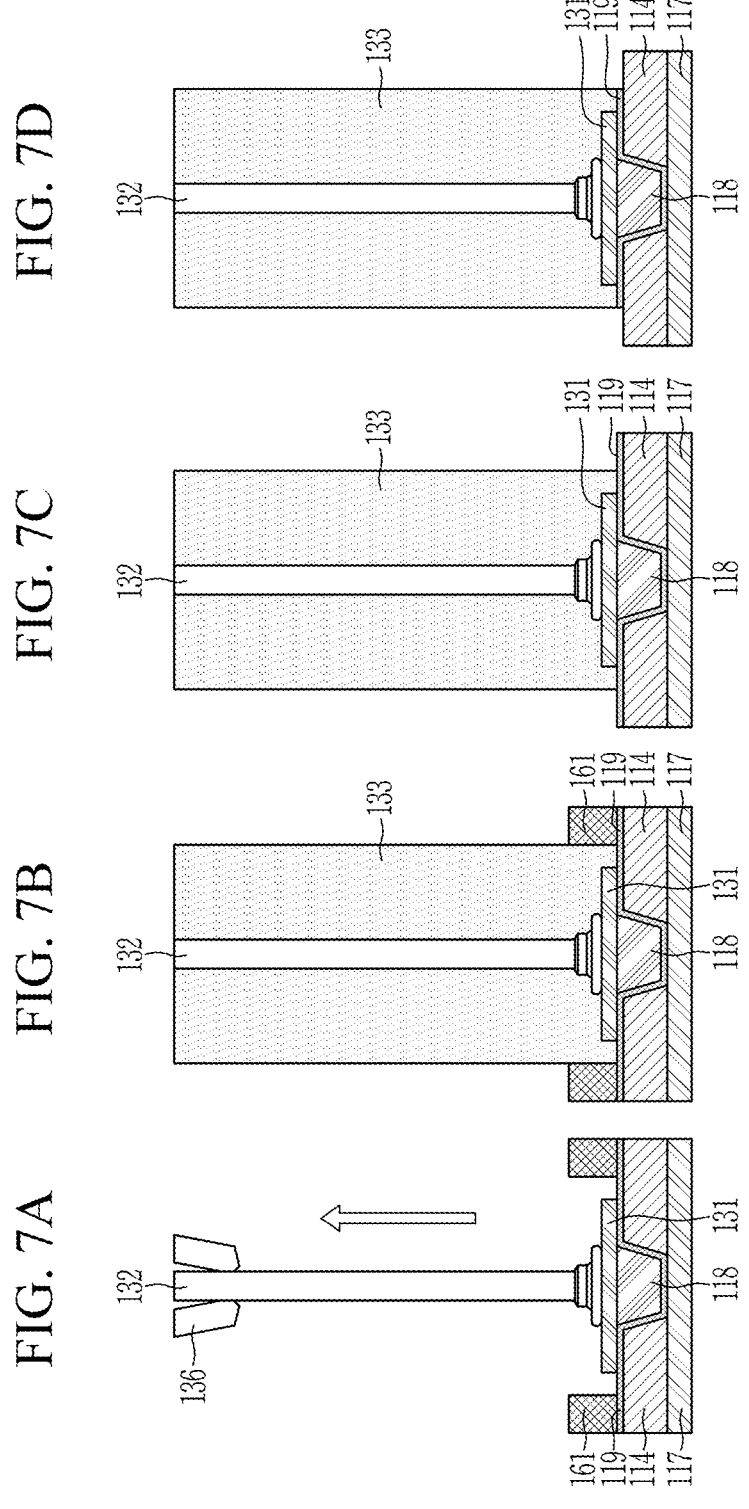
FIGS. 7A to 7D illustrate cross-sectional views of intermediate structures corresponding to intermediate steps for illustrating a method for manufacturing a semiconductor package according to some embodiments.

FIGS. 7A to 7D illustrate cross-sectional views of intermediate structures corresponding to intermediate steps for illustrating a method for manufacturing a semiconductor package according to some embodiments. FIG. 7A illustrates a cross-sectional view of pulling the bonding wire 132a to form the vertical wire 132; FIG. 7B illustrates a cross-sectional view of forming the metal portion 133 extending around (e.g., surrounding) the vertical wire 132; FIG. 7C illustrates a cross-sectional view of stripping the second photoresist pattern 161; and FIG. 7D illustrates a cross-sectional view of removing (e.g., a portion of) the (e.g., exposed) metal seed layer 119.

Contents of FIG. 7A may be the same as the contents of FIG. 3A described above.

Referring to FIG. 7B, the metal portion 133 extending around (e.g., surrounding) the vertical wire 132 may be formed. The metal portion 133 may be formed by growing a metal film around the vertical wire 132 by electroplating, but is not limited thereto. In some embodiments, the metal portion 133 may be formed to match a width in the first direction X (and/or the second direction Y) of an opening of the second photoresist pattern 161. For example, the metal portion 133 may fill the opening of the second photoresist pattern 161, so that a side surface of the metal portion 133 may contact a side surface of the second photoresist pattern 161 defining the opening of the second photoresist pattern 161. In some embodiments, the width of the first bonding pad 131 in the first direction X (and/or the second direction Y) may be smaller than that of the first coupling member 130, including the metal portion 133 and the vertical wire 132, but larger than that of the vertical wire 132 alone. In some embodiments, a lowermost end of the metal portion 133 may contact an uppermost end of the first bonding pad 131.

Referring to FIG. 7C, the second photoresist pattern 161 may be stripped. After the second photoresist pattern 161 is stripped, a portion of the upper surface of the metal seed layer 119 may be exposed.

Contents of FIG. 7D may be the same as the contents of FIG. 3D described above.

Figure 8A:
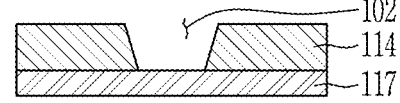
FIGS. 8A to 8G illustrate cross-sectional views of intermediate structures corresponding to intermediate steps for illustrating a method for manufacturing a semiconductor package according to some embodiments.
Figure 8B:
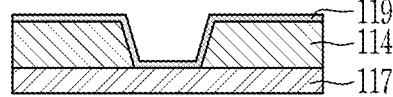
Figure 8C:
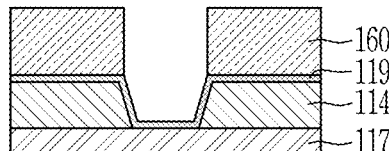
Figure 8D:
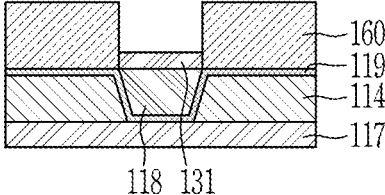
Figure 8E:
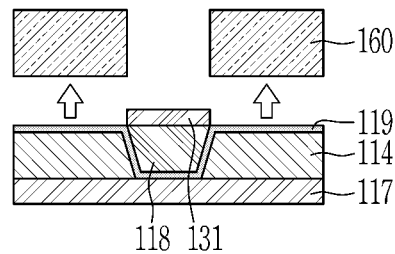
Figure 8F:
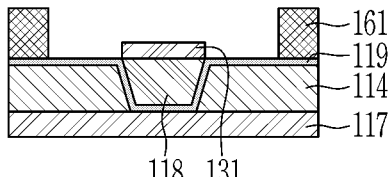
Figure 8G:
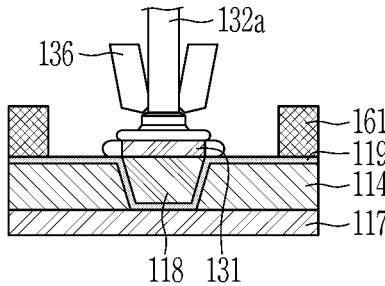

FIGS. 8A to 8G illustrate cross-sectional views of intermediate structures corresponding to intermediate steps for illustrating a method for manufacturing a semiconductor package according to some embodiments. FIG. 8A illustrates a cross-sectional view of forming a via hole 102 in the uppermost first dielectric layer 114 (e.g., lastly disposed additional first dielectric layer 114) of the front side redistribution layer substrate 110; FIG. 8B illustrates a cross-sectional view of forming the metal seed layer 119 on the uppermost first dielectric layer 114 and in the via hole 102 of the uppermost first dielectric layer 114 of the front side redistribution layer substrate 110; FIG. 8C illustrates a cross-sectional view of forming the first photoresist pattern 160 on the metal seed layer 119 on the front side redistribution layer substrate 110; FIG. 8D illustrates a cross-sectional view of filling the via hole 102 with a metal to form the third redistribution via 118 and form the first bonding pad 131 on the third redistribution via 118; FIG. 8E illustrates a cross-sectional view of stripping the first photoresist pattern 160; FIG. 8F illustrates a cross-sectional view of forming the second photoresist pattern 161 on the metal seed layer 119 on the front side redistribution layer substrate 110; and FIG. 8G illustrates a cross-sectional view of forming (e.g., bonding) the bonding wire 132a on the first bonding pad 131 and the metal seed layer 119.

Contents of FIG. 8A and FIG. 8B may be the same as the contents of FIG. 2A to FIG. 2B described above.

Referring to FIG. 8C, the first photoresist pattern 160 may be formed on the metal seed layer 119 on the front side redistribution layer substrate 110. Only the metal seed layer 119 deposited in the via hole 102 may be exposed.

Referring to FIG. 8D, the third redistribution via 118 may be formed by filling the via hole 102 with metal, and the first bonding pad 131 may be formed on the third redistribution via 118. The width of the first bonding pad 131 in the first direction X (and/or the second direction Y) may be the same as that of the third redistribution via 118.

The third redistribution via 118 and the first bonding pad 131 may be formed by electroplating, but is not limited thereto. The third redistribution via 118 and the first bonding pad 131 may be formed by growing a metal film from the previously formed metal seed layer 119 by electroplating.

Referring to FIG. 8E, the first photoresist pattern 160 may be stripped. After the first photoresist pattern 160 is stripped, a portion of the upper surface of the metal seed layer 119 may be exposed. A portion of the upper surface of the metal seed layer 119 below the third redistribution via 118 may not be exposed.

Referring to FIG. 8F, the second photoresist pattern 161 may be formed on the metal seed layer 119 on the front side redistribution layer substrate 110. The second photoresist pattern 161 may be formed to be spaced apart from the first bonding pad 131. After the second photoresist pattern 161 is formed, a portion of the upper surface of the metal seed layer 119 may remain exposed.

Referring to FIG. 8G, one end of the bonding wire 132a may be formed (e.g., bonded) onto the first bonding pad 131 by using the capillary 136 or a wedge (not shown). The width of the first bonding pad 131 in the first direction X (and/or the second direction Y) may be formed to be narrow (e.g., same width as the width of the upper surface for the third redistribution via 118 in the first direction X and/or the second direction Y), so that (e.g., the lower surface of) the bonding wire 132a may be disposed on (e.g., cover) the upper and side surfaces of the first bonding pad 131.

Figures 9A, 9B, 9C, 9D:
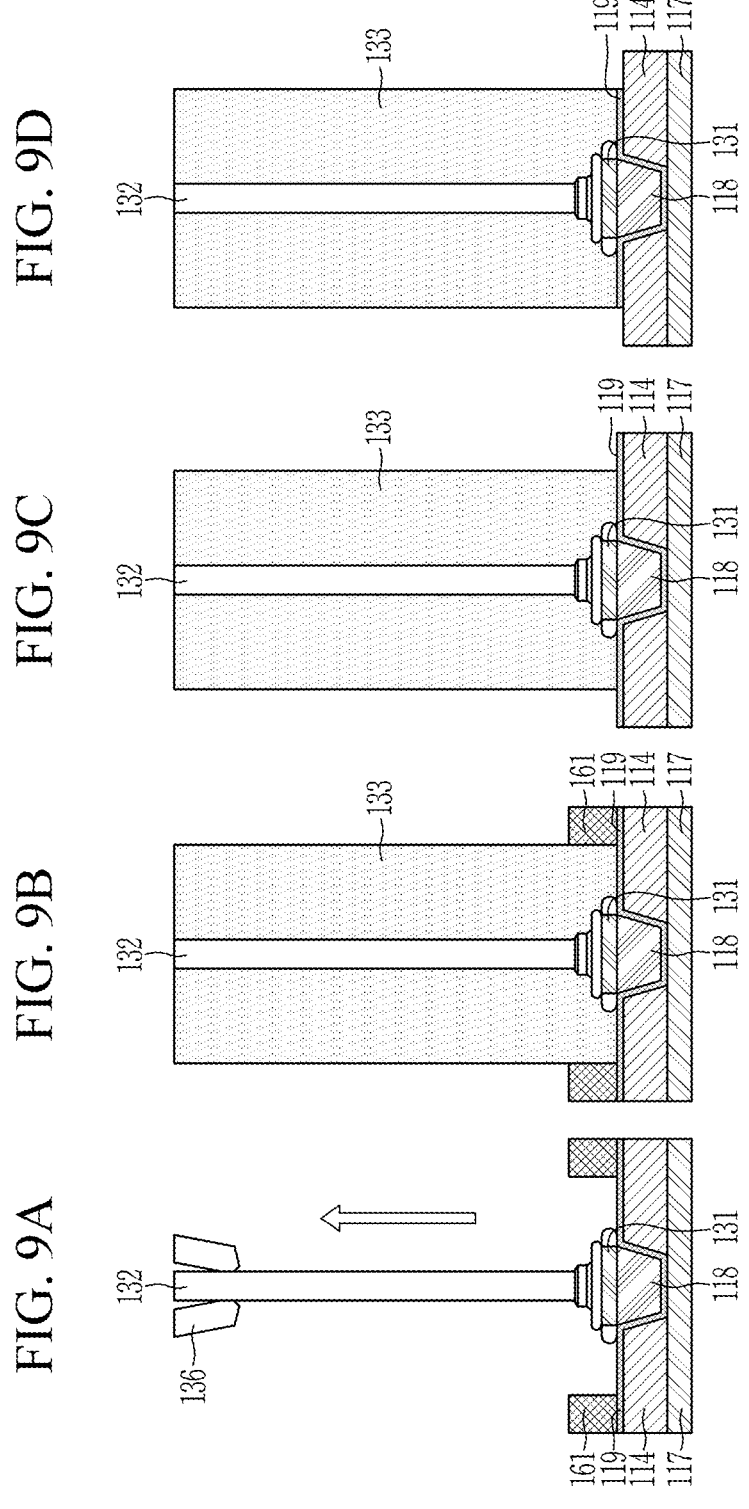
FIGS. 9A to 9D illustrate cross-sectional intermediate structures corresponding to intermediate steps for illustrating a method for manufacturing a semiconductor package according to some embodiments.

FIGS. 9A to 9D illustrate cross-sectional views intermediate structures corresponding to intermediate steps for illustrating a method for manufacturing a semiconductor package according to some embodiments. FIG. 9A illustrates a cross-sectional view of pulling the bonding wire 132a to form a vertical wire 132; FIG. 9B illustrates a cross-sectional view of forming a metal portion 133 extending around (e.g., surrounding) the vertical wire 132; FIG. 9C illustrates a cross-sectional view of stripping the second photoresist pattern 161; and FIG. 9D illustrates a cross-sectional view of removing (e.g., a portion of) the (e.g., exposed) metal seed layer 119.

Contents of FIG. 9A may be the same as the contents of FIG. 3A described above.

Referring to FIG. 9B, the metal portion 133 extending around (e.g., surrounding) the vertical wire 132 may be formed. The metal portion 133 may be formed by growing a metal film around the vertical wire 132 by electroplating, but is not limited thereto. In some embodiments, the metal portion 133 may be formed to match a width in the first direction X (and/or the second direction Y) of an opening of the second photoresist pattern 161. For example, the metal portion 133 may fill the opening of the second photoresist pattern 161, so that a side surface of the metal portion 133 may contact a side surface of the second photoresist pattern 161 defining the opening of the second photoresist pattern 161. In some embodiments, since the vertical wire 132 is disposed on (e.g., covers) the upper and side surfaces of the first bonding pad 131, the metal portion 133 may be spaced apart from the first bonding pad 131.

Referring to FIG. 9C, the second photoresist pattern 161 may be stripped. After the second photoresist pattern 161 is stripped, a portion of the metal seed layer 119 may be exposed.

Contents of FIG. 9D may be the same as the contents of FIG. 3D described above.

Figure 10A:
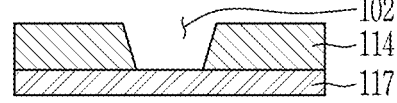
FIGS. 10A to 10F illustrate cross-sectional views of intermediate structures corresponding to intermediate steps for illustrating a method for manufacturing a semiconductor package according to some embodiments.
Figure 10B:
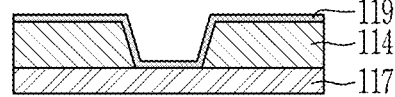
Figure 10C:
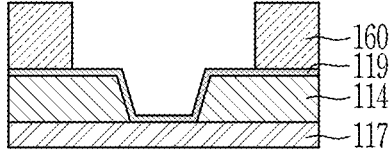
Figure 10D:
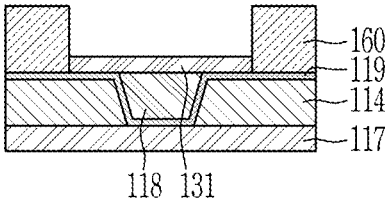
Figure 10E:
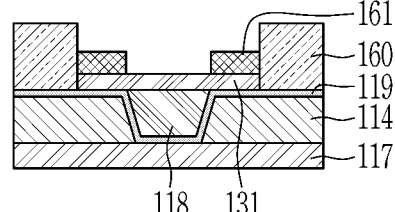
Figure 10F:
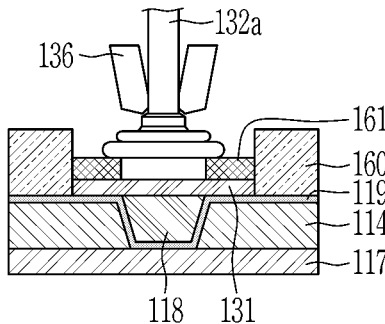

FIGS. 10A to 10F illustrate cross-sectional views of intermediate structures corresponding to intermediate steps for illustrating a method for manufacturing a semiconductor package according to some embodiments. FIG. 10A illustrates a cross-sectional view of forming a via hole 102 in the uppermost first dielectric layer 114 (e.g., lastly disposed additional first dielectric layer 114) of the front side redistribution layer substrate 110; FIG. 10B illustrates a cross-sectional view of forming the metal seed layer 119 on the uppermost first dielectric layer 114 and in the via hole 102 of the uppermost first dielectric layer 114 of the front side redistribution layer substrate 110; FIG. 10C illustrates a cross-sectional view of forming the first photoresist pattern 160 on the metal seed layer 119 on the front side redistribution layer substrate 110; FIG. 10D illustrates a cross-sectional view of filling the via hole 102 with a metal to form the third redistribution via 118 and form the first bonding pad 131 on the third redistribution via 118; FIG. 10E illustrates a cross-sectional view of forming the second photoresist pattern 161 on the first bonding pad 131; and FIG. 10F illustrates a cross-sectional view of forming (e.g., bonding) the bonding wire 132a on the first bonding pad 131.

Contents of FIG. 10A to FIG. 10D may be the same as the contents of FIG. 2A to FIG. 2D described above.

Referring to FIG. 10E, the second photoresist pattern 161 may be formed on the first bonding pad 131. The second photoresist pattern 161 may be formed within the opening of the first photoresist pattern 160. The first photoresist pattern 160 may extend around the second photoresist pattern 161. In some embodiments, at least a portion of the upper surface of the first bonding pad 131 may be exposed from the first and the second photoresist patterns 160 and 161. The second photoresist pattern 161 may have a less height in the third direction Z than that of the first photoresist pattern 160 in the third direction Z.

Referring to FIG. 10F, one end of the bonding wire 132a may be formed (e.g., bonded) onto the first bonding pad 131 by using the capillary 136 or a wedge (not shown). The bonding wire 132a may fill the opening of the second photoresist pattern 161 and may overlap (e.g., cover) a portion of the upper surface of the second photoresist pattern 161.

FIGS. 11A to 11D illustrate cross-sectional views of intermediate structures corresponding to intermediate steps for illustrating a method for manufacturing a semiconductor package according to some embodiments. FIG. 11A illustrates a cross-sectional view of pulling the bonding wire 132a to form the vertical wire 132; FIG. 11B illustrates a cross-sectional view of forming the metal portion 133 extending around (e.g., surrounding) the vertical wire 132; FIG. 11C illustrates a cross-sectional view of stripping the first photoresist pattern 160 and the second photoresist pattern 161; and FIG. 11D illustrates a cross-sectional view of removing (e.g., a portion of) the (e.g., exposed) metal seed layer 119.

Contents of FIG. 11A may be the same as the contents of FIG. 3A described above.

Referring to FIG. 11B, the metal portion 133 extending around (e.g., surrounding) the vertical wire 132 may be formed. The metal portion 133 may be formed by growing a metal film around the vertical wire 132 by electroplating, but is not limited thereto. In some embodiments, the metal portion 133 may be formed to match the width of the opening of the first photoresist pattern 160 in the first direction X (and/or the second direction Y). For example, the metal portion 133 may fill the opening of the first photoresist pattern 160, so that a side surface of the metal portion 133 may contact a side surface of the first photoresist pattern 160 defining the opening of the first photoresist pattern 160. In some embodiments, since the vertical wire 132 may be disposed on (e.g., cover) the upper surface of the first bonding pad 131 and the first photoresist pattern 160 may be disposed on (e.g., cover) the side surface of the first bonding pad 131, the metal portion 133 may be spaced apart from the first bonding pad 131.

Referring to FIG. 11C, the first photoresist pattern 160 and the second photoresist pattern 161 may be stripped. After the first photoresist pattern 160 and the second photoresist pattern 161 are stripped, the side surface and a portion of the upper surface of the first bonding pad 131 and a portion of the upper surface of the metal seed layer 119 may be exposed, and the lowermost end of the metal portion 133 may be spaced apart from the uppermost end of the first bonding pad 131.

Contents of FIG. 11D may be the same as the contents of FIG. 3D described above.

Figure 12:
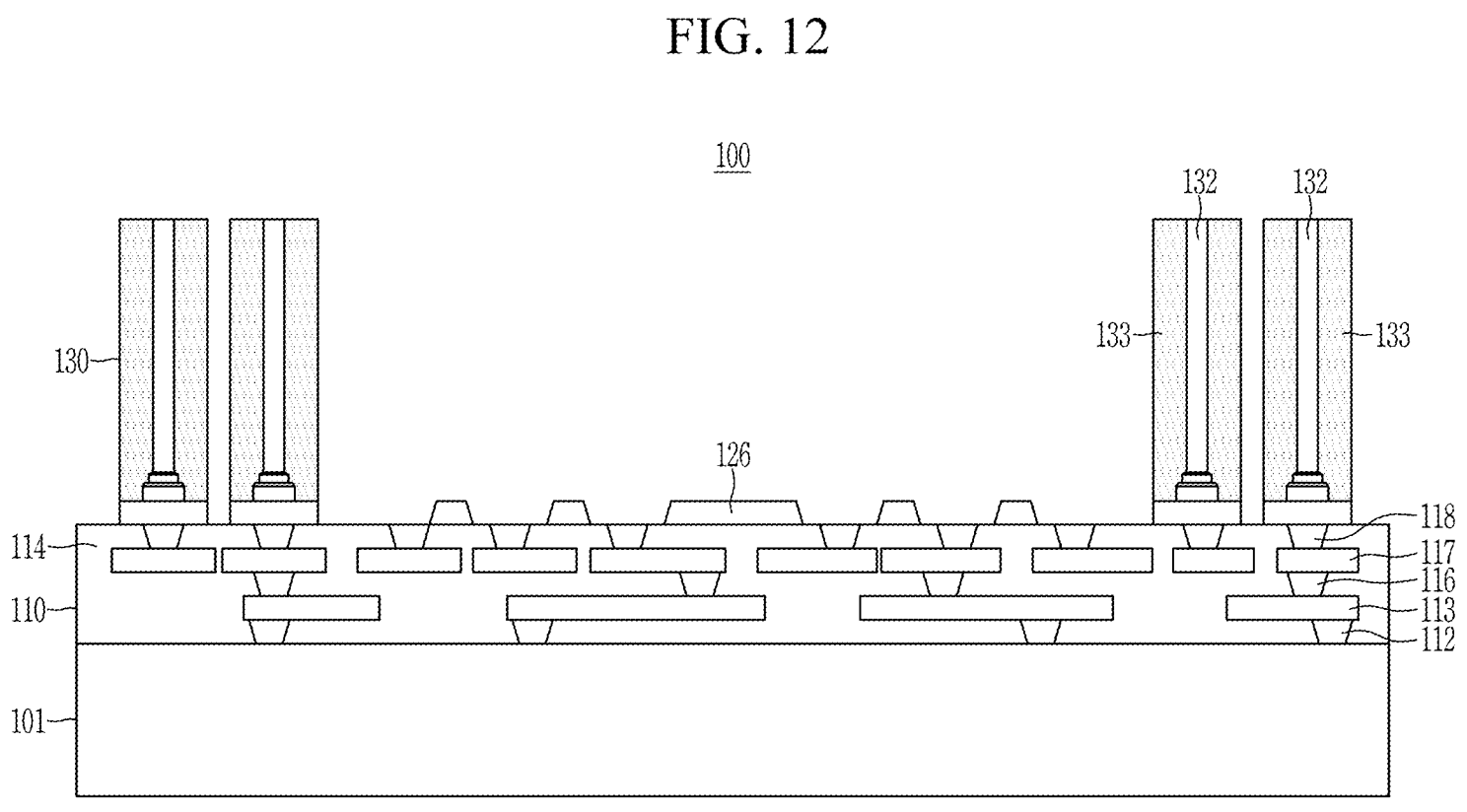

FIG. 12 illustrates a cross-sectional view of a step of forming a first coupling member 130 on the front side redistribution layer substrate 110 according to some embodiments.

Referring to FIG. 12, the first coupling member 130 may be vertically disposed on the front side redistribution layer substrate 110. The first coupling member 130 may include the vertical wire 132 and the metal portion 133 according to the embodiments of FIG. 2 to FIG. 11. Since the first coupling members 130 may be arranged with a fine pitch and a high aspect ratio, a small and light semiconductor package may be manufactured. In addition, according to the method of fabricating the semiconductor package 100 using the first coupling member 130 according to the present disclosure, the process cost may be reduced compared to a process using a metal post structure.

Figure 13:
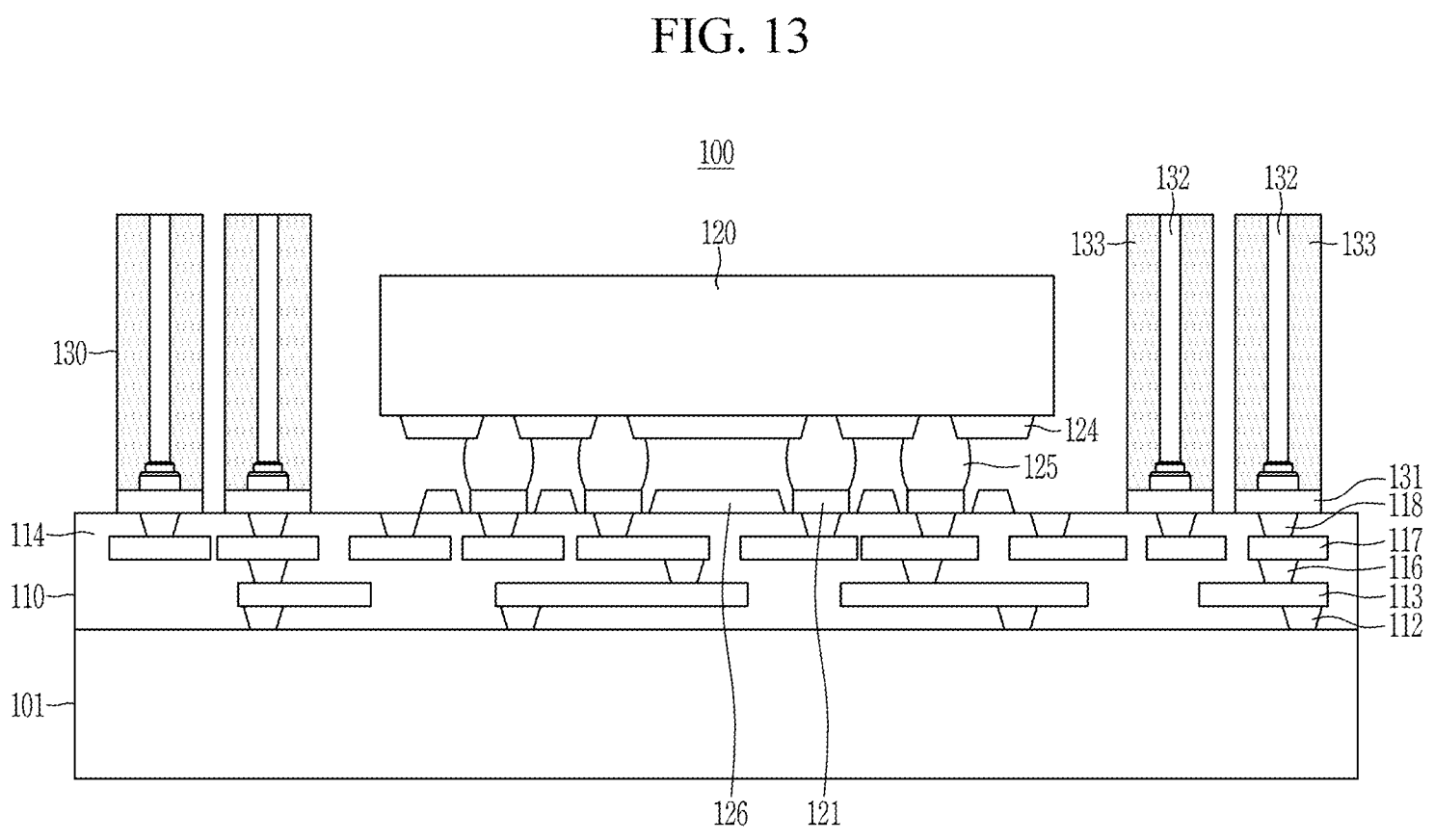

FIG. 13 illustrates a cross-sectional view of a step of mounting a semiconductor chip 120 on the front side redistribution layer substrate 110 according to some embodiments.

Referring to FIG. 13, the semiconductor chip 120 may be mounted on the front side redistribution layer substrate 110. The semiconductor chip 120 may be bonded to second bonding pads 121 disposed on the upper surface of the front side redistribution layer substrate 110 by a second coupling member 125 formed on a lower surface of the semiconductor chip 120. The second coupling member 125 may be referred to as a connection member. The semiconductor chip 120 may be spaced apart from the first coupling member 130. In some embodiments, the first coupling member 130 may not overlap with the semiconductor chip 120 in the third direction Z. The lower surface of the semiconductor chip 120 may face the upper surface of the front side redistribution layer substrate 110. A second insulating layer 124 may be disposed on the lower surface of semiconductor chip 120. In some embodiments, the second insulating layer 124 may be a solder resist. The second insulating layer 124 may include a plurality of openings for the second coupling member 125. The second coupling member 125 electrically connects the first redistribution layer substrate 110 and the semiconductor chip 120.

Figure 14:
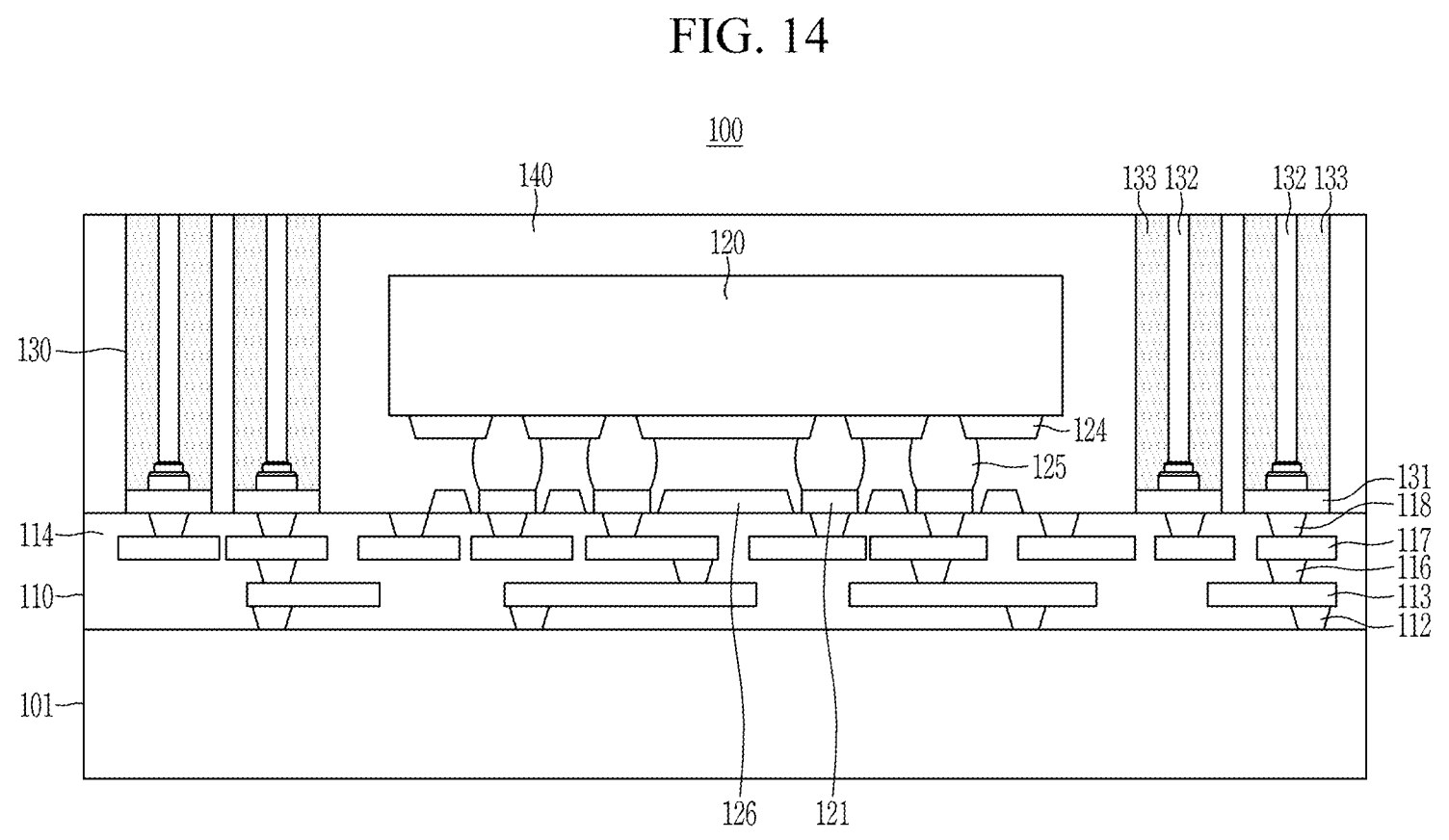

FIG. 14 illustrates a cross-sectional view of a step of molding the semiconductor chip 120 and the first coupling member 130 with an encapsulant 140 on the front side redistribution layer substrate 110 according some the embodiments.

Referring to FIG. 14, the encapsulant may be disposed on the upper surface of the front side redistribution layer substrate 110, the first coupling member, and the semiconductor chip 120. For example, the semiconductor chip 120 and the first coupling member 130 may be molded with the encapsulant 140. In some embodiments, the process of molding with the encapsulant 140 may include a compression molding or transfer molding process, but is not limited thereto. In some embodiments, a chemical and mechanical polishing (CMP) process may be performed on an upper surface of the encapsulant 140 after the molding process with the encapsulant 140. When a coupling member made of only the vertical wire 132 is molded, the vertical wire 132 may be swept due to molding flow. However, according to the present disclosure, since the metal portion 133 is formed around the vertical wire 132 to reinforce the vertical wire 132, it is possible to prevent the first coupling member 130 from being swept during the molding process.

Figure 15:
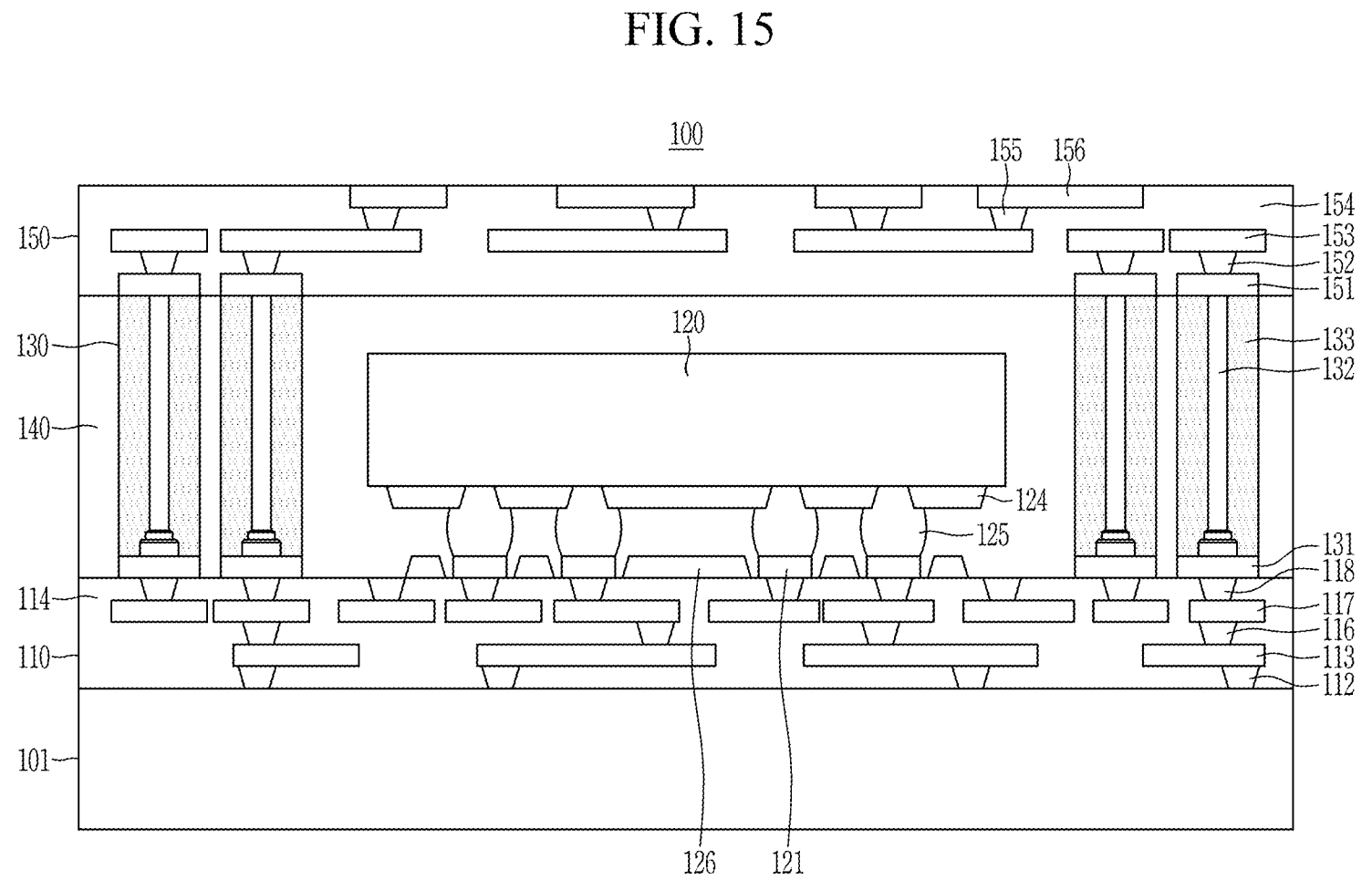

FIG. 15 illustrates a cross-sectional view of a step of forming a back side redistribution layer substrate 150 on the encapsulant 140 and the first coupling member 130 according to some embodiments.

Referring to FIG. 15, the back side redistribution layer substrate 150 may be formed on the encapsulant 140 and the first coupling member 130.

The back side redistribution layer substrate 150 may include a second dielectric layer 154, and third to fifth redistribution lines 151, 153, and 156 and fourth to fifth redistribution vias 152 and 155 within the second dielectric layer 154. In some embodiments, the back side redistribution layer substrate 150 may include fewer or greater number of (e.g., fewer or greater number of different vertical levels of) redistribution lines and redistribution vias.

The back side redistribution layer substrate 150 may be formed by applying the same characteristics of the manufacturing process of the front side redistribution layer substrate 110 as described above. In some embodiments, one end of the first coupling member 130 may be electrically connected to the front side redistribution layer substrate 110 (e.g., through the first bonding pad 131), and the other end of the first coupling member 130 may be electrically connected to the back side redistribution layer substrate 150.

Figure 16:
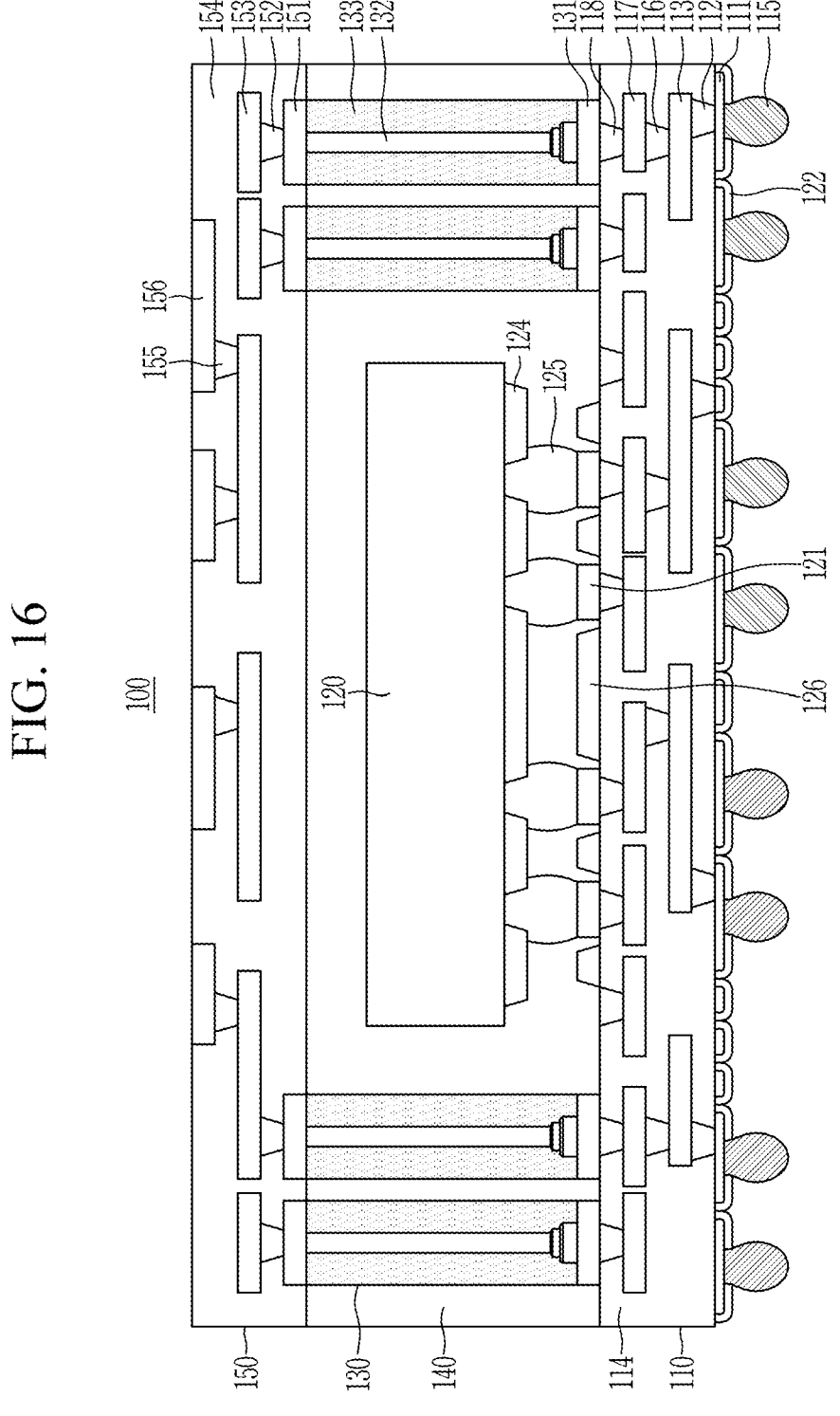
FIG. 16 illustrates a cross-sectional view of an intermediate structure corresponding to intermediate steps for illustrating a method for manufacturing a semiconductor package according to some embodiments.

FIG. 16 illustrates a cross-sectional view of a step of removing the carrier 101 and forming an external coupling terminal 115 under the front side redistribution layer substrate 110 according to some embodiments.

Referring to FIG. 16, the carrier 101 may be removed from the front side redistribution layer substrate 110, a third bonding pad 111 and a third insulating layer 122 may be formed under the lower surface of the front side redistribution layer substrate 110, and the external coupling terminal 115 may be bonded to the third bonding pad 111.

While this disclosure has been described in connection with what is presently considered to be practical embodiments, it is to be understood that the disclosure is not limited to the disclosed embodiments, but, on the contrary, is intended to cover various modifications and equivalent arrangements included within the scope of the appended claims.

What is claimed is:

1. A semiconductor package comprising:
a first redistribution layer substrate;
a semiconductor chip on the first redistribution layer substrate;
a coupling member on the first redistribution layer substrate, wherein the coupling member is spaced apart from the semiconductor chip;
an encapsulant on the first redistribution layer substrate, the semiconductor chip, and the coupling member; and
a second redistribution layer substrate on the encapsulant,
wherein the coupling member includes a bonding wire and a metal portion extending around the bonding wire,
wherein the bonding wire includes a compressed ball and a vertical wire stretched from the compressed ball, and
wherein a first end of the coupling member is electrically connected to the first redistribution layer substrate, and a second end of the coupling member is electrically connected to the second redistribution layer substrate.

2. The semiconductor package of claim 1, wherein the bonding wire includes at least one of gold, silver, copper, and an alloy thereof.

3. The semiconductor package of claim 1, wherein the metal portion includes at least one of copper, nickel, zinc, gold, silver, platinum, palladium, chromium, titanium, and an alloy thereof.

4. A semiconductor package comprising: a first redistribution layer substrate including a redistribution line and a redistribution via on the redistribution line;
a bonding pad on the redistribution line and the redistribution via;
a coupling member on the bonding pad;
a semiconductor chip on the first redistribution layer substrate, wherein the semiconductor chip is spaced apart from the coupling member;
a connection member that electrically connects the first redistribution layer substrate and the semiconductor chip;
an encapsulant on the bonding pad, the coupling member, the connection member, and the semiconductor chip; and
a second redistribution layer substrate on the encapsulant,
wherein the coupling member includes a bonding wire and a metal portion extending around the bonding wire,
wherein the bonding wire includes a compressed ball and a vertical wire stretched from the compressed ball, and
wherein a first end of the coupling member is electrically connected to the bonding pad, and a second end of the coupling member is electrically connected to the second redistribution layer substrate.

5. The semiconductor package of claim 4, wherein the bonding pad includes at least one of copper, nickel, zinc, gold, silver, platinum, palladium, chromium, titanium, and an alloy thereof.

6. The semiconductor package of claim 4, wherein the bonding wire covers on an upper surface and a side surface of the bonding pad.

7. The semiconductor package of claim 4, wherein a width of the coupling member in a direction is the same as a width of the bonding pad in the direction.

8. The semiconductor package of claim 4, wherein a width of the coupling member in a direction is narrower than a width of the bonding pad in the direction.

9. The semiconductor package of claim 4, wherein a width of the bonding pad in a direction is narrower than a width of the coupling member in the direction and wider than a width of the vertical wire in the direction.

10. The semiconductor package of claim 4, wherein a lowermost end of the metal portion is spaced apart from an uppermost end of the bonding pad.

11. The semiconductor package of claim 4, wherein a lowermost end of the metal portion is in contact with an uppermost end of the bonding pad.

* * * * *